United States Patent
Campagna

(10) Patent No.: US 10,191,129 B2
(45) Date of Patent: Jan. 29, 2019

(54) OPERATING A MAGNETIC RESONANCE TOMOGRAPH

(71) Applicant: Swen Campagna, Engelthal (DE)

(72) Inventor: Swen Campagna, Engelthal (DE)

(73) Assignee: Siemens Aktiengesellschaft, München (DE)

( * ) Notice: Subject to any disclaimer, the term of this patent is extended or adjusted under 35 U.S.C. 154(b) by 876 days.

(21) Appl. No.: 14/645,242

(22) Filed: Mar. 11, 2015

(65) Prior Publication Data

US 2015/0260818 A1    Sep. 17, 2015

(30) Foreign Application Priority Data

Mar. 11, 2014  (DE) .................. 10 2014 204 446

(51) Int. Cl.
*G01V 3/00* (2006.01)
*G01R 33/36* (2006.01)

(52) U.S. Cl.
CPC ................ *G01R 33/3621* (2013.01)

(58) Field of Classification Search
USPC ........................................................ 324/309
See application file for complete search history.

(56) References Cited

U.S. PATENT DOCUMENTS

| | | | | |
|---|---|---|---|---|
| 5,424,735 A * | 6/1995 | Arkas | ................... | H03M 1/12 341/144 |
| 7,573,956 B2 * | 8/2009 | Lazar | ................... | H03M 1/125 341/110 |
| 2002/0087063 A1 * | 7/2002 | Lou | ................... | G01R 33/3621 600/410 |
| 2006/0269275 A1 * | 11/2006 | Krause | ................ | G11B 27/034 396/310 |
| 2008/0136417 A1 * | 6/2008 | Baumgartl | ............ | G01R 33/36 324/322 |
| 2008/0240533 A1 * | 10/2008 | Piron | ................... | G01R 33/482 382/131 |
| 2009/0012387 A1 * | 1/2009 | Hanson | ................. | A61B 5/055 600/411 |

(Continued)

FOREIGN PATENT DOCUMENTS

DE    102013201724 A1    8/2014

OTHER PUBLICATIONS

German Office Action for related German Application No. 10 2014 204 446.4, dated Oct. 31, 2014, with English Translation.

*Primary Examiner* — Rodney Fuller
(74) *Attorney, Agent, or Firm* — Lempia Summerfield Katz LLC

(57) ABSTRACT

A method for operating a magnetic resonance tomograph having at least one receiving antenna, at least one converter device for analog/digital conversion and a programmable computing device is provided. The method includes generating, with the converter device, digital measured values by digitizing the analog reception signal from the receiving antenna and/or at least one analog signal derived from the reception signal. A time-coding device adds an item of time information that describes the recording time of the measured values to each of the digital measured values or to groups of measured values including a plurality of the digital measured values in order to generate a time-coded data stream. The programmable computing device processes the time-coded data stream further.

17 Claims, 2 Drawing Sheets

(56) References Cited

U.S. PATENT DOCUMENTS

| | | | |
|---|---|---|---|
| 2009/0251141 A1* | 10/2009 | Baumgartl | G01R 33/36 324/307 |
| 2010/0260293 A1* | 10/2010 | Roeven | G01R 33/3621 375/340 |
| 2012/0245453 A1* | 9/2012 | Tryggestad | A61B 6/463 600/413 |
| 2014/0062480 A1* | 3/2014 | Bollenbeck | G01R 33/3621 324/309 |
| 2014/0257096 A1* | 9/2014 | Prevrhal | G01T 1/2985 600/431 |
| 2015/0077108 A1* | 3/2015 | Adolf | G01R 33/5659 324/309 |
| 2015/0091563 A1* | 4/2015 | Lu | A61B 5/055 324/309 |
| 2016/0054413 A1* | 2/2016 | Demharter | G01R 33/3607 324/309 |

* cited by examiner

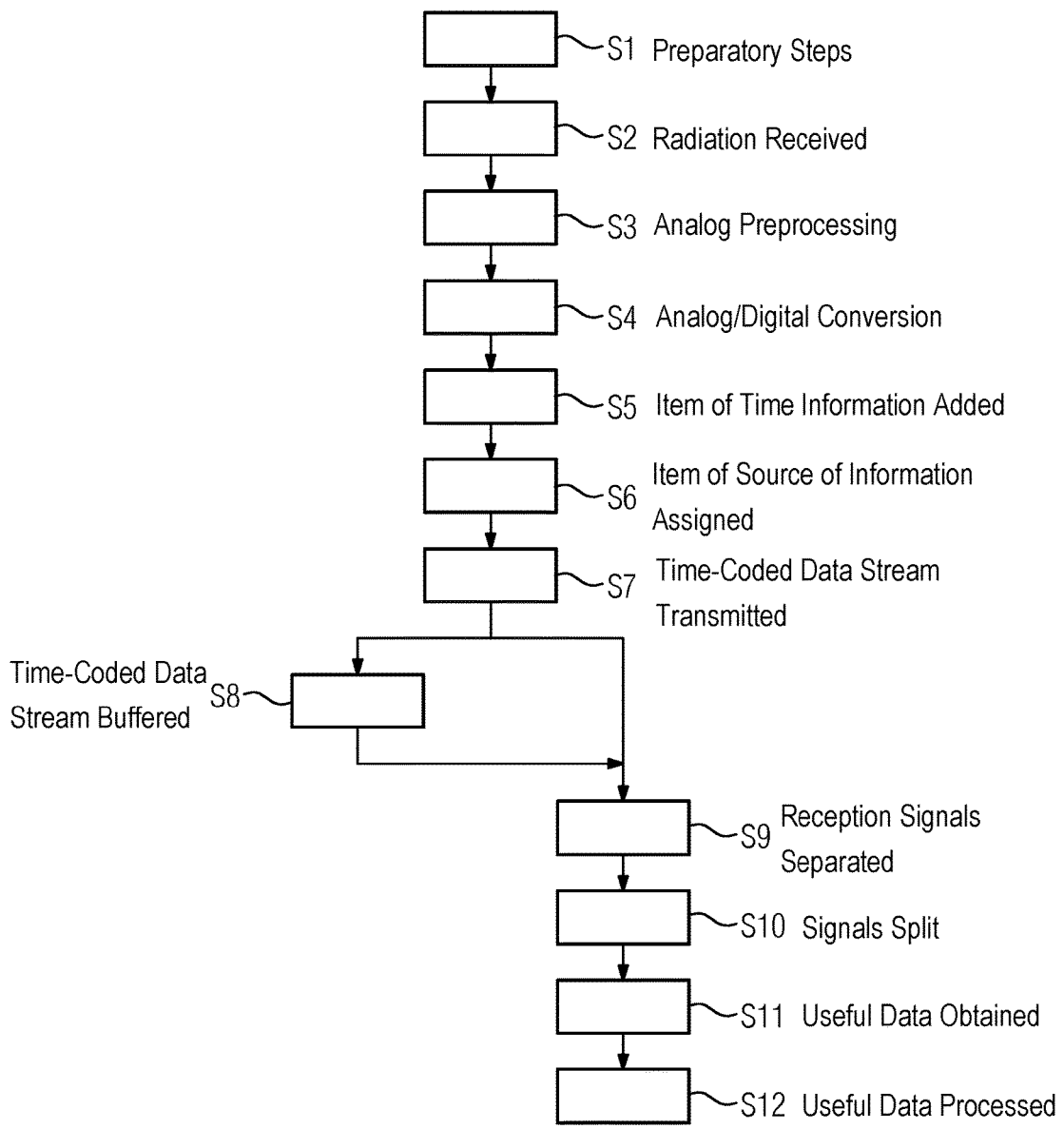

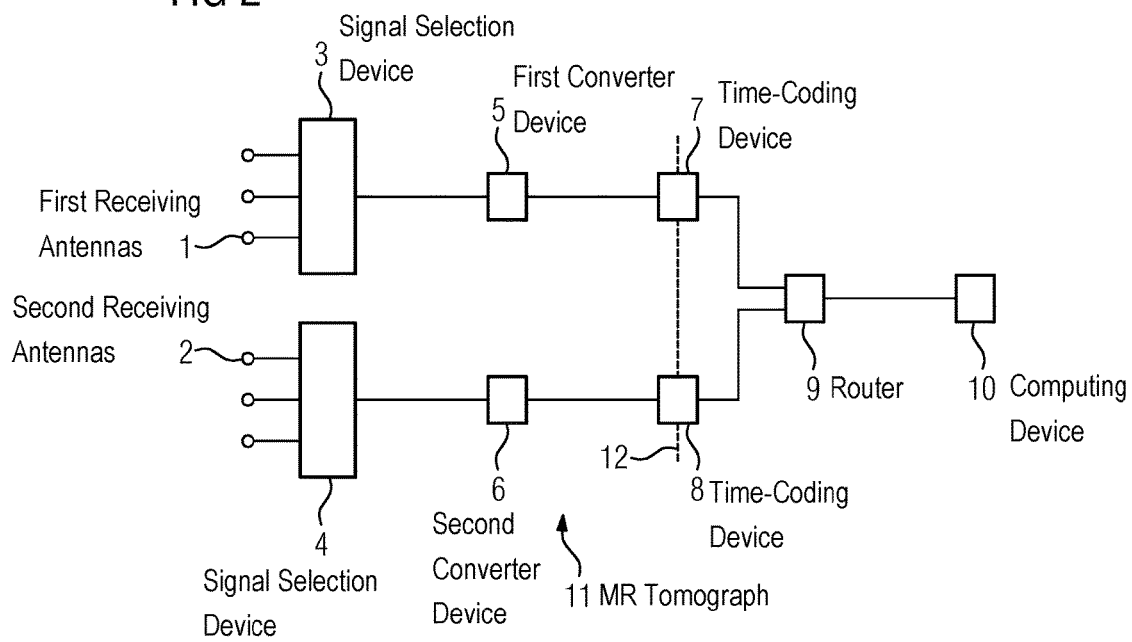

OPERATING A MAGNETIC RESONANCE TOMOGRAPH

This application claims the benefit of DE 10 2014 204 446.4, filed on Mar. 11, 2014, which is hereby incorporated by reference in its entirety.

BACKGROUND

The present embodiments relate to operation of a magnetic resonance tomograph having at least one receiving antenna, at least one converter device for analog/digital conversion and a programmable computing device.

Magnetic resonance tomographs have a body coil and/or a plurality of local receiving antennas or local coils for receiving magnetic resonance signals. After reception, these signals are processed, and information obtained from the signals is made available to a data processing device in order to generate the respectively desired data records (e.g., images or 3-D data records).

One or more signal distribution devices may supply a particular number of analog input channels to a particular number of analog output channels during analog signal selection or signal combination. These analog output channels are supplied to a converter device that carries out analog/digital conversion. In this case, for example, a frequency shift to an intermediate frequency may be carried out before the analog/digital conversion. In this case, the analog/digital conversion is carried out continuously with predefined clocking.

The digital signals are supplied to a digital receiving device that processes said data further and extracts information from the data. The information is made available to the processing device. In this case, the digital data is processed in the digital receiving device in a sample-synchronous manner with the analog/digital conversion in the converter device. Therefore, at least parts of the data processing in the digital receiving device is to be carried out in hard real time with a maximum response time of half a clock length of the analog/digital converter. In order to achieve this, digital receiving circuits are implemented as hard-wired circuits or programmable circuits.

The digital receiving device, for example, carries out the preprocessing in this case, during which the received signals are demodulated (e.g., the relevant information is obtained from the signals). The volume of data is reduced in the digital receiving device by "punching out" only the data for the required measurement periods from the useful data. The data reduced in this manner are then made available to the data processing device via a buffer.

The method for receiving the signals from the magnetic resonance tomograph is therefore relatively complex and requires a large part of the data processing to be carried out in hard real time with very short response times. On account of these requirements, a conventional receiving method may be used only on specific complicated hardware.

SUMMARY AND DESCRIPTION

The scope of the present invention is defined solely by the appended claims and is not affected to any degree by the statements within this summary.

The present embodiments may obviate one or more of the drawbacks or limitations in the related art. For example, operation of a magnetic resonance tomograph that is improved with respect to the technical effort needed to carry out the method in comparison to the prior art is provided.

In one embodiment, a method includes generating, using the converter device, digital measured values by digitizing the analog reception signal from the receiving antenna and/or at least one analog signal derived from the reception signal. A time-coding device adds an item of time information that describes the recording time of the measured values, to each of the digital measured values or to groups of measured values including a plurality of the digital measured values in order to generate a time-coded data stream. The programmable computing device processes the time-coded data stream further.

The requirement of hard real time with extremely short response times immediately after the digitization is canceled by adding an item of time information to each of the digital measured values or to groups of measured values. In this case, an item of time information may be explicitly inserted into the time-coded data stream. However, the time information may also be provided by inserting the measured values or groups of measured values into a predefined data structure that makes it possible to subsequently determine the recording time. The time information may be an item of absolute time information that describes a recording time with respect to an externally predefined time reference point. In this case, the time reference point may be predefined, for example, by a control device of the magnetic resonance tomograph, thus enabling particularly simple and also subsequent synchronization of the control data and the measurement data. However, the time information may also be an item of relative time information that describes the relative recording times of the measured values or the groups of measured values with respect to one another.

Since the requirement of hard real time with a sample-accurate response time (e.g., sample-accurate real time) has been canceled in the method according to one or more of the present embodiments by adding the time information in all subsequent processing steps, it is possible in the method to carry out the entire digital data processing by a programmable computing device (e.g., a computer including a processor). Therefore, a digital receiving device that carries out data processing in sample-accurate real time may be dispensed with in the method.

Moving digital processing steps to a programmable computing device avoids costs for additional switching groups, may reduce development costs since implementation of an algorithm on a programmable computing device is typically more easily possible than the development of a corresponding circuit, and enables greater flexibility during data acquisition since changes in the data preprocessing are also possible simply by using other algorithms on the programmable computing device. In the method according to one or more of the present embodiments, all digital measured values, for example, are processed together by a programmable computing device and may therefore be linked in any desired manner during further processing. Therefore, restrictions during data evaluation that are unavoidable in conventional methods on account of the use of a plurality of separate digital receiving devices that separately process the digital measured values are dispensed with.

In this case, the reception signal or the derived analog signal may be demodulated during further processing. The signals that are supplied to the converter device may be either measurement signals from the magnetic resonance tomograph or signals that were generated by converting the measurement signals to an intermediate frequency. In this case, the reception signals may be characterized by the magnetic resonance signal of hydrogen, which has a Larmor frequency of somewhat more than 40 MHz/T. The derived analog signals may be provided by conversion to an intermediate frequency. Such frequencies may still be in the low megahertz range or at least in the high kilohertz range. Since sampling may be carried out at least at twice the signal frequency, large volumes of data are generated during analog/digital conversion.

A frequency-dependent amplitude of the reception signals may be evaluated as the useful signal when evaluating magnetic resonance tomography measurements. The volume of data may be greatly reduced by demodulating the reception signal or the derived analog signal in order to obtain this useful signal. As explained at the outset, this has previously been carried out in a separate digital receiving device. However, since the measured values are converted into a time-coded data stream directly after the analog/digital conversion in the method according to one or more of the present embodiments, it is possible to move this demodulation to the programmable computing device.

Further functions that have previously been carried out on a separate digital receiving device, such as the number of relevant time windows from the measurement data and a channel selection of the channels to be received or reception signals, may also be carried out by the programmable computing device in the method according to one or more of the present embodiments. Alternatively, it would also be possible to already carry out the channel selection before the analog/digital conversion.

A plurality of the reception signals or the derived signals may be digitized. An item of source information that assigns the respective measured value or the respective group of measured values to a reception signal or a derived signal is additionally added to each of the digital measured values or to each group of measured values during the generation of the time-coded data stream. This provides that the digital measured values may always be assigned to a reception signal or a derived signal during subsequent further processing by the programmable computing device.

In this case, digital measured values that are assigned different items of source information may be combined during the further processing of the time-coded data stream, such that a digital representation of superimposition of the assigned reception signals or of the assigned derived signals is generated. In this case, the digital measured values that are assigned to a respective item of source information form a digital representation of the reception signal or of the derived signal itself. The formation of a weighted sum of digital measured values that are assigned to different items of source information, in which case a phase shift may additionally be provided for the respective sources, may be used, for example, to calculate modes of coils or to convert received modes back to reception signals. Such modes add the reception signals that are phase-shifted, for example, from a plurality of receiving antennas. In this case, different modes give different weightings to signals that come from different regions of the examination volume. Subsequently generating such modes in the programmable computing device makes it possible to considerably reduce the processing effort for some applications, but a high signal-to-noise ratio may nevertheless be achieved in the important image regions. Instead of the reception signals from the receiving antennas themselves, different modes may already be received as derived signals. In this case, the modes may be converted back to the original reception signals by the programmable computing device in the method according to one or more of the present embodiments.

During the generation of the time-coded data stream, the time information may be added to each of the digital measured values or to each group of measured values as a time value representing the time information, for example. If it is provided that a particular response time is reliably achieved by the programmable computing device and the communication interface between the converter device and the programmable computing device, the time information may also be provided by writing the measured values to a data structure (e.g., a buffer). In this case, the product of the number of measured values that may be buffered and the conversion interval between two analog/digital conversions by the converter device is at least twice as large as the average response time of the programmable computing device.

Adding an item of time information in the method according to one or more of the present embodiments provides that downstream further processing is possible at any desired time without any real-time requirements. Therefore, the time-coded data stream may be stored on a storage medium that retains a memory state without a power supply. In this case, a redundant array of independent disks (RAID) may be used, for example, as the storage medium. In this case, RAIDs may achieve, for example, high data storage reliability and may simultaneously provide the high data transfer rates required. Alternatively or additionally, solid state disks or other storage media may also be used.

Buffering the data makes it possible to carry out further processing at any desired subsequent time. This is advantageous since, during subsequent evaluations of the data, a digital representation of the original reception signals or of the derived signals may be resorted to, thus achieving greater flexibility during data evaluation. In addition, buffering the data also makes it possible to carry out further processing of the data that is not possible in real time for a given computing power of the programmable computing device.

The reception signal or the derived signal may be continuously digitized with predefined clocking. Clocked conversion avoids received signals being distorted by irregular reading. This is advantageous, for example, in the case of high conversion rates, as are typically used in magnetic resonance tomographs.

The present embodiments also relate to a magnetic resonance tomograph configured to carry out the method according to one or more of the present embodiments.

In this case, the magnetic resonance tomograph includes at least one receiving antenna, at least one converter device for analog/digital conversion of the reception signal from the receiving antenna and/or of at least one analog signal derived from the reception signal, a programmable computing device (e.g., a processor), and a time-coding device that, in order to generate a time-coded data stream of digital measured values output by the converter device or groups of measured values including a plurality of the digital measured values, is configured to add an item of time information that describes the recording time of the measured values.

In this case, the time-coding device may be, for example, in the form of a common structural unit with the converter device or the programmable computing device, but separate formation of the time-coding device is also possible. Common clocking of the converter device and of the time-coding device may be provided using a supplied clock signal. Alternatively, it is also possible for the converter device and the time-coding device to communicate using clocking predefined by the converter device itself. The time-coding device may also be supplied, for example, with a synchronization signal by a control device of the magnetic resonance tomograph that controls examinations by the magnetic resonance tomograph. From this synchronization signal, the time information is generated, or the synchronization signal is taken into account when determining the time information. Measured values or groups of measured values may be assigned to individual steps of a measurement protocol in a particularly simple and reliable manner.

The time-coding device may be a hard-wired or programmably wired circuit with a permanently predefined function. The function may therefore be predefined by hard-wiring of components, the formation of at least one application-specific integrated circuit, and/or the programming of field-programmable gate arrays. For example, the function of the time-coding device may not be determined by a program that is executed on a processor.

The time-coding device may include, for example, a buffer memory for buffering the digital measured values. Buffering the digital measured values provides that an item of time information may also be assigned to groups of digital measured values that were recorded in succession. As a result of the use of a buffer, a longer response time is available, at least in the short term, in processing steps that are carried out after buffering. In this case, the necessary response time for hard real time before buffering becomes a necessary response time for soft real time after buffering (e.g., this response time must only be guaranteed on a statistical average). After buffering, the necessary response time for the hard real time is extended by a scaling factor that corresponds to the buffer length.

The magnetic resonance tomograph according to one or more of the present embodiments includes a plurality of receiving antennas and a signal selection device that is used to select at least one of the reception signals and/or at least one of the derived signals as the signal to be digitized. Existing converter devices and the associated further elements of the receiving path may therefore be used in an improved manner, for example, since different signals may be supplied to the existing converter devices and the associated further elements of the receiving path depending on the application.

Additionally or alternatively, the magnetic resonance tomograph may include a plurality of the receiving antennas and a superimposition device that is used to generate at least one derived signal by superimposing at least two of the reception signals. In this case, the modes that have already been described and have different sensitivities in different regions of an examination volume may, for example, be generated. In this case, the superimposition may be carried out, for example, by adding the signals with a respectively predefined amplitude and/or phase.

The magnetic resonance tomograph according to one or more of the present embodiments may include a plurality of separate converter devices that are used to provide the time-coding device with digital measurement data. Since an item of time information and, for example, an item of source information are assigned to the digital measurement data in the time-coding device, the plurality of converter devices may be synchronized in a particularly simple manner in the magnetic resonance tomograph according to one or more of the present embodiments. For example, there is no need to use common clocking of the plurality of converter devices. The time-coding device may also separately convert the digital measurement data from the separate converter devices into individual time-coded data streams. The individual data streams may then be separated in any desired manner or may be processed together.

Since the digital measured values in the magnetic resonance tomograph according to one or more of the present embodiments are uniquely assigned to a time and, for example, a source, data may also be transmitted from the time-coding device to the programmable computing device in a packet-based manner, for example. This is advantageous, for example, when a plurality of converter devices, to the digital measured values or groups of measured values of which time information is separately added, are used.

BRIEF DESCRIPTION OF THE DRAWINGS

FIG. 1 schematically shows a flowchart of an exemplary embodiment of the method; and FIG. 2 schematically shows an exemplary embodiment of a magnetic resonance tomograph.

DETAILED DESCRIPTION

FIG. 1 schematically shows one embodiment of a method for operating a magnetic resonance tomograph. In this case, a measurement sequence of the magnetic resonance tomograph has already been initiated at the start of the flowchart shown (e.g., an examination object is already in the magnetic resonance tomograph, and all preparatory steps have been carried out).

Preparatory steps for recording measurement data follow in act S1. For example, magnetic fields are accordingly adjusted in the magnetic resonance tomograph, and the examination object is excited in the examination region. In this case, the specific procedure is dependent on the type of measurement, in which case numerous measurement methods for magnetic resonance tomographs are known in the prior art. Regions of the examination object emit high-frequency electromagnetic radiation (e.g., in the two-digit or three-digit megahertz range), as a result of corresponding excitation. In this case, the amplitude, the phase and/or the frequency of the emitted signal, for example, is dependent on the location.

In act S2, the radiation emitted by the examination object is received by a plurality of receiving antennas of the magnetic resonance tomograph. In this case, the receiving antennas are also referred to as receiving coils. In this case, use is made, for example, of body coils that detect electromagnetic radiation from the entire examination region and/or local coils that are arranged close to the examination object and accordingly detect electromagnetic radiation from a particular region in a particularly effective manner.

Analog preprocessing of the analog reception signals received in act S2 is then carried out in act S3. In this case, the reception signals from the receiving antennas are selected or combined differently depending on the measurement carried out in order to supply the reception signals to a converter device for analog/digital conversion. In this case, particular reception signals may not be supplied to the converter device, a plurality of reception signals may be combined to form a mode signal that has a different distribution of the measurement sensitivity in the examination region than the signals from the individual receiving antennas, and/or one or more of the reception signals may be converted to an intermediate frequency. In this case, different reception signals may be converted to different intermediate frequencies, for example, and may be supplied to an individual channel of the converter device via a common line. Corresponding preprocessing steps are known in the prior art and will not be explained in any more detail here.

Analog/digital conversion of the reception signals or of the analog signals derived from the reception signals, as explained with respect to act S3, is carried out in act S4. For this purpose, the signals are each supplied to a converter device or to a channel of a converter device that continuously digitizes the signals with predefined clocking. In this case, the clocking is jointly predefined for all converter devices or all channels of the converter device. Alternatively, separate clocking may be predefined for each converter device or each channel of the converter device.

In act S5, an item of time information is respectively added to groups of measured values including a plurality of the digital measured values. For this purpose, the received digital measured values are stored in respectively separate buffers for the separate converter devices or for the separate channels of the converter device. In addition, an item of time information is determined for the respective first digital measured value stored in the buffer.

In order to determine the time information, the control device of the magnetic resonance tomograph provides the time-coding device with a synchronization signal that describes a respective step of a measurement protocol. Within each step of the measurement protocol, an internal counter, which is incremented in sync with the clock signal made available to the converter device, also stipulates a relative time. The relative time within the step of the measurement protocol and the step of the measurement protocol together form the time information. This information is stored together with the buffer. A unique recording time is therefore also assigned to subsequent values in the buffer based on the time information and the known clocking. If, in an alternative embodiment, individual channels of a converter device or individual converter devices are clocked separately, the time information is advantageously derived from the respective clocking.

An item of source information is additionally assigned to the group of measured values (e.g., the buffer) in act S6. In this case, the source information may be assigned, in principle, at any desired time (e.g., even already before the method begins or at the beginning of each step in a measurement sequence). In this case, the source information describes which analog reception signal and therefore which receiving antenna the digital measured values in the group of measured values are assigned to and from which analog reception signals and in what manner the derived signal has been generated. For this purpose, the control device of the magnetic resonance tomograph provides the time-coding device with the control information for the signal selection device. From this control information, it is clear which reception signals or which derived signals are assigned to which converter device or which channel.

Alternatively, the source information may describe only the converter device or the channel of the converter device that converted the signal. Since separate buffers are already provided for the individual converter devices or channels, this information is implicitly available. During the further processing of the time-coded data stream, the configuration of the signal selection device may be determined at the recording time based on the assigned time information. The original reception signal or the way in which the derived end signal was generated may therefore be inferred solely from the information relating to which converter device or which channel a digital measured value is assigned to.

In act S7, a time-coded data stream is transmitted from the time-coding device to the programmable computing device. For this purpose, after buffering a predefined number of digital measured values and when changing the step in the measurement sequence, the buffers are each transferred, together with the source information and the time information, to a predefined data structure and are transmitted as a time-coded data stream using said data structure. For this purpose, the accordingly supplemented data structure is written to a transmission buffer from which the supplemented data structure is transmitted to the programmable computing device using any desired protocol.

The programmable computing device may buffer the time-coded data stream in act S8. In this case, a storage medium that retains a memory state without a power supply (e.g., a RAID of hard disks) is used for buffering. Alternatively, the computing device may also directly process the time-coded data stream beginning with act S9.

Temporary or permanent storage of the time-coded data stream in act S8 makes it possible to carry out the further processing beginning with act S9 at any desired subsequent time. This is advantageous, for example, when the measured values are intended to be processed further using an alternative method at a subsequent time. For example, only some of the reception signals or the derived analog signals may be evaluated during the measurement in order to achieve fast imaging, for example. Higher-quality further processing may then be carried out at any desired subsequent time starting from the stored time-coded data stream. Additionally or alternatively, buffering of the time-coded data stream in act S8 also makes it possible to use complex further processing algorithms that may not be executed in real time on a given computing device.

The evaluation of the time-coded data stream begins with act S9, in which reception signals that were transmitted at different intermediate frequencies using a common line are separated. For this purpose, the digital measured values that are assigned to a derived signal composed in this manner are digitally filtered in order to obtain separate frequency bands each including a signal converted to an intermediate frequency in the frequency band. Optionally, the separated signals may then be converted to a common intermediate frequency. This is advantageous, for example, when the separated signals are intended to be used to separate or form modes in the following act S10.

In act S10, signals having source information that indicates that the signals are derived signals generated by mode formation are split into digital representations of the original analog reception signals. Measured values that are assigned to analog reception signals or derived analog signals may be additionally combined to form mode signals. For this purpose, the respective digital representations of the analog reception signals or the derived signals are scaled and, for example, phase-shifted and are then added to one another or subtracted from one another. In this case, the procedure corresponds to the known procedure for analog formation or separation of mode signals.

After act S10, the time-coded data stream is processed further such that digital representations of the analog reception signals and/or of mode signals formed from the latter and/or reception or mode signals converted to intermediate frequencies are available. However, these representations are available at a sampling rate that corresponds to the clocking of the converter device. Therefore, the volume of data is reduced for the purpose of processing the data further. In magnetic resonance tomography, for imaging, use is made of the fact that the Larmor frequency of atoms (e.g., hydrogen atoms) is proportional to the magnetic field in which the corresponding atom is situated. Therefore, spatial coding is carried out by magnetic field gradients that influence the relative phase between the oscillating nuclear spins and the respective oscillation frequency.

In this case, the central information to be acquired is how large a received signal amplitude is for different frequency shifts. The volume of data may therefore be greatly reduced by demodulating the digital representations in order to determine an amplitude that is dependent on the frequency shift. Corresponding methods for the spectral evaluation of the signals are known in the prior art. Therefore, a fast Fourier transformation is mentioned here purely by way of example.

The useful data obtained in act S11 is then processed further in act S12 (e.g., an image and/or a 3-D data record may be generated). The type of further processing depends on the specifically used measurement method. A number of measurement methods and corresponding evaluation methods for the useful data provided in act S11 are known in the prior art.

In an alternative embodiment of the method according to FIG. 1, it would be possible to already apply signal analysis (e.g., a fast Fourier transformation) to the overall signal in act S9. The separation of signals at different intermediate frequencies may therefore be combined with the demodulation of these signals, for example.

FIG. 2 schematically shows an exemplary embodiment of a magnetic resonance tomograph 11. The magnetic resonance tomograph 11 includes three first receiving antennas 1 and three second receiving antennas 2. The first receiving antennas 1 and the second receiving antennas 2 are each supplied to a signal selection device 3, 4 that, based on control by a control device (not shown) of the magnetic resonance tomograph 11, respectively selects one of the receiving antennas 1, 2 and supplies the reception signal from this receiving antenna 1, 2 to the first converter device 5 or to the second converter device 6.

Alternatively, instead of the signal selection device 3 and/or 4, a superimposition device may be used to generate a mode signal and/or to convert the frequency of the reception signals from the receiving antennas 1, 2 to different intermediate frequencies and to combine the resulting signals. In this case, apart from adaptation of the program executed on the programmable computing device 10, the further elements of the magnetic resonance tomograph would not need to be modified since the evaluation of the measurement data, including the consideration of different modes and the separation of signals at different intermediate frequencies, is carried out completely in the programmable computing device 10. The first and second converter devices 5, 6 each convert the reception signals from the receiving antennas 1, 2, which are supplied by the signal selection device 3, 4, with clocking predefined by a control device (not shown), into digital measured values that are transmitted to the time-coding devices 7, 8 with the predefined clocking. Time information and source information is added to the digital measured values in the time-coding devices 7, 8, as described with respect to FIG. 1.

The dashed line 12 indicates that, as a result of the time information being added to the digital measured values in the time-coding device 7, 8, a transition is made from hard real time with a maximum response time of half a predefined clocking interval to soft real time in which it is necessary to achieve only an average response time predefined by the size of storage and transmission buffers. In this case, a relatively large buffer may already be provided in the time-coding devices 7, 8, with the result that the real-time requirements are practically irrelevant in the region to the right of the dashed line 12. Alternatively, however, relatively small buffers may be provided in the time-coding device 7, 8, and larger buffers or buffers for longer periods may be used only when the digital measured values are received by the programmable computing device or only after some processing steps.

After the time information has been added to the digital measured values, the digital measured values are transmitted by the time-coding devices 7, 8 to a router 9 in the form of a time-coded data stream. A packet-based protocol is used for this purpose since such a protocol makes it possible to combine a plurality of data streams in a particularly simple manner. The router 9 forwards the data streams received from the time-coding devices 7, 8 via separate connections to the programmable computing device 10 via a common signal line.

The use of the router 9 is optional in this case. Alternatively, provision may be made for each of the time-coding devices 7, 8 to be separately connected to the programmable computing unit 10.

The illustration of the receiving antennas 1, 2, the signal selection devices 3, 4, the converter devices 5, 6, the time-coding devices 7, 8, the router 9 and the programmable computing device 10 as separate devices is used, for example, for greater clarity of the illustration. In one implementation of the magnetic resonance tomograph shown, some of the components may be arranged in common housings. For example, a local coil may already include a plurality of receiving antennas 1, 2, a signal selection device 3, 4, and/or a superimposition device and a converter device. Alternatively, a signal selection device 3, 4 may be arranged in a common housing together with a superimposition device and a converter device 5, 6.

For example, the time-coding device 7, 8 may be integrated in the converter device 5, 6 or may form a plug-in card, a module or the like for the programmable computing unit 10. The possible combinations are purely exemplary, and a number of further possible embodiments emerge for a person skilled in the art.

Although the invention is illustrated and described more specifically in detail by the exemplary embodiments, the invention is not restricted by the disclosed examples, and other variations may be derived therefrom by a person skilled in the art without departing from the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for operating a magnetic resonance tomograph having at least one receiving antenna, at least one converter device for analog/digital conversion, and a programmable computing device, the method comprising:

generating, by the at least one converter device, digital measured values, the generating comprising digitizing an analog reception signal from the at least one receiving antenna, at least one analog signal derived from the analog reception signal, or a combination thereof;

adding, by a time-coding device, an item of time information that describes a recording time of the digital measured values to each of the digital measured values or to groups of digital measured values comprising a plurality of the digital measured values in order to generate a time-coded data stream; and further processing, by the programmable computing device, the time-coded data stream.

2. The method of claim 1, wherein the further processing, by the programmable computing device, comprises demodulating the analog reception signal or the at least one derived analog signal.

3. The method of claim 2, wherein a plurality of the analog reception signals or the derived analog signals are digitized, an item of source information that assigns the respective digital measured value or the respective group of measured values to an analog reception signal or a derived analog signal being additionally added to each of the digital measured values or to each group of measured values during the generation of the time-coded data stream.

4. The method of claim 3, wherein digital measured values that are assigned different items of source information are combined during the further processing of the time-coded data stream, such that a digital representation of superimposition of the assigned analog reception signals or of the assigned derived analog signals is generated.

5. The method of claim 1, wherein a plurality of the analog reception signals or the derived analog signals are digitized, an item of source information that assigns the respective digital measured value or the respective group of measured values to an analog reception signal or a derived analog signal being additionally added to each of the digital measured values or to each group of measured values during the generation of the time-coded data stream.

6. The method of claim 5, wherein digital measured values that are assigned different items of source information are combined during the further processing of the time-coded data stream, such that a digital representation of superimposition of the assigned analog reception signals or of the assigned derived analog signals is generated.

7. The method of claim 1, wherein during the generation of the time-coded data stream, the time information is added to each of the digital measured values or to each group of digital measured values as a time value representing the time information.

8. The method of claim 1, wherein the time-coded data stream is stored on a storage medium that retains a memory state without a power supply.

9. The method of claim 1, wherein the analog reception signal or the at least one derived analog signal is continuously digitized with predefined clocking.

10. A magnetic resonance tomograph comprising:
at least one receiving antenna;
at least one converter device operable for analog/digital conversion of a reception signal from the at least one receiving antenna, analog/digital conversion of at least one analog signal derived from the reception signal, or analog/digital conversion of a combination thereof;
a programmable computing device; and
a time-coding device that, in order to generate a time-coded data stream of digital measured values output by the at least one converter device or groups of measured values comprising a plurality of the digital measured values, is configured to add an item of time information that describes a recording time of the digital measured values.

11. The magnetic resonance tomograph of claim 10, wherein the time-coding device comprises a hard-wired or programmably wired circuit with a permanently predefined function.

12. The magnetic resonance tomograph of claim 11, wherein the at least one receiving antenna comprises a plurality of receiving antennas, and
wherein the magnetic resonance tomograph further comprises a superimposition device configured to generate at least one derived signal by superimposition of at least two of the reception signals.

13. The magnetic resonance tomograph of claim 12, wherein the at least one converter device comprises a plurality of separate converter devices configured to provide the time-coding device with digital measurement data.

14. The magnetic resonance tomograph of claim 10, wherein the time-coding device comprises a buffer memory for buffering the digital measured values.

15. The magnetic resonance tomograph of claim 10, wherein the at least one receiving antenna comprises a plurality of receiving antennas, and
wherein the magnetic resonance tomograph further comprises a signal selection device configured to select at least one of the reception signals, at least one of the derived analog signals, or a combination thereof as a signal to be digitized.

16. The magnetic resonance tomograph of claim 10, wherein the at least one receiving antenna comprises a plurality of receiving antennas, and
wherein the magnetic resonance tomograph further comprises a superimposition device configured to generate at least one derived signal by superimposition of at least two of the reception signals.

17. The magnetic resonance tomograph of claim 10, wherein the at least one converter device comprises a plurality of separate converter devices configured to provide the time-coding device with digital measurement data.

* * * * *